United States Patent
Jeong

(10) Patent No.: US 10,181,757 B2
(45) Date of Patent: Jan. 15, 2019

(54) APPARATUS AND METHODS FOR SHIELDING A WIRELESS POWER TRANSMITTER

(71) Applicant: QUALCOMM Incorporated, San Diego, CA (US)

(72) Inventor: Seong Heon Jeong, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 274 days.

(21) Appl. No.: 15/155,585

(22) Filed: May 16, 2016

(65) Prior Publication Data
US 2017/0085134 A1    Mar. 23, 2017

Related U.S. Application Data

(60) Provisional application No. 62/219,932, filed on Sep. 17, 2015.

(51) Int. Cl.
*H02J 50/12* (2016.01)
*H02J 50/60* (2016.01)
(Continued)

(52) U.S. Cl.
CPC ........... *H02J 50/12* (2016.02); *H01F 27/36* (2013.01); *H01F 27/362* (2013.01); *H01F 27/365* (2013.01); *H01F 38/14* (2013.01); *H02J 7/025* (2013.01); *H02J 50/10* (2016.02); *H02J 50/60* (2016.02); *H02J 50/70* (2016.02);
(Continued)

(58) Field of Classification Search
None
See application file for complete search history.

(56) References Cited

U.S. PATENT DOCUMENTS 9,793,741 B2 * 10/2017 Yeo .................. H02J 7/025
2014/0375262 A1 * 12/2014 Yamaguchi .......... H01Q 7/06
320/108

(Continued)

FOREIGN PATENT DOCUMENTS

JP        2013138044 A    7/2013
WO      WO-0002212 A1    1/2000
(Continued)

OTHER PUBLICATIONS

International Search Report and Written Opinion—PCT/US2016/050130—ISA/EPO—dated Feb. 3, 2017.

*Primary Examiner* — Jared Fureman
*Assistant Examiner* — Joel Barnett
(74) *Attorney, Agent, or Firm* — Knobbe, Martes, Olson & Bear, LLP

(57) ABSTRACT

Methods and apparatus are disclosed for wirelessly transmitting power. In one aspect, an apparatus for wireless transmitting power is provided. The apparatus comprises a first metal sheet having a shape that defines a plurality of slots, the plurality of slots inwardly extending from a periphery of the first metal sheet. The apparatus further comprises a coil configured to generate a magnetic field sufficient to charge or power a load, wherein the first metal sheet extends over a width and a length of the coil, and wherein the plurality of slots are configured to at least partially cancel eddy currents generated in the first metal sheet via the magnetic field.

30 Claims, 11 Drawing Sheets

(51) Int. Cl.
*H02J 50/80* (2016.01)
*H02J 7/02* (2016.01)
*H01F 38/14* (2006.01)
*H05K 9/00* (2006.01)
*H02J 50/10* (2016.01)
*H02J 50/70* (2016.01)
*H01F 27/36* (2006.01)
*H04B 15/02* (2006.01)
*H05K 1/02* (2006.01)
*H05K 1/16* (2006.01)

(52) U.S. Cl.
CPC ............. *H02J 50/80* (2016.02); *H04B 15/02* (2013.01); *H05K 1/0227* (2013.01); *H05K 9/0081* (2013.01); *H05K 1/0239* (2013.01); *H05K 1/165* (2013.01); *H05K 2201/09672* (2013.01)

(56) References Cited

U.S. PATENT DOCUMENTS

| | | | |
|---|---|---|---|
| 2015/0028687 A1* | 1/2015 | Ichikawa | H01F 38/14 307/104 |
| 2015/0197155 A1* | 7/2015 | Lu | B60L 11/182 320/108 |
| 2015/0206047 A1 | 7/2015 | Herslow et al. | |
| 2015/0244181 A1 | 8/2015 | Kagami et al. | |
| 2015/0270717 A1* | 9/2015 | Fujimaki | B60L 11/182 307/10.1 |
| 2016/0380480 A1* | 12/2016 | Yang | H02J 50/70 307/104 |

FOREIGN PATENT DOCUMENTS

| WO | WO-2010133995 A2 | 11/2010 |
|---|---|---|
| WO | WO-2013117973 A2 | 8/2013 |
| WO | WO-2013165421 A1 | 11/2013 |

* cited by examiner

| | Transmitter | | Receiver | |
|---|---|---|---|---|
| | L1 (uH) | R1 (ohm) | L2 (nH) | R2 (ohm) |
| 1. Coil / Full Metal Table | 2.3 | 1.4 | 1445 | 0.7 |
| 2. Coil / OPEN / Full Metal | 2.5 | 1.4 | 1475 | 0.7 |
| 3. Coil / SEGM / Full Metal | 2.4 | 1.4 | 1460 | 0.7 |

Shorted Slot

Open Slot Overlapped

Parallel with Coil Turns

Slashed

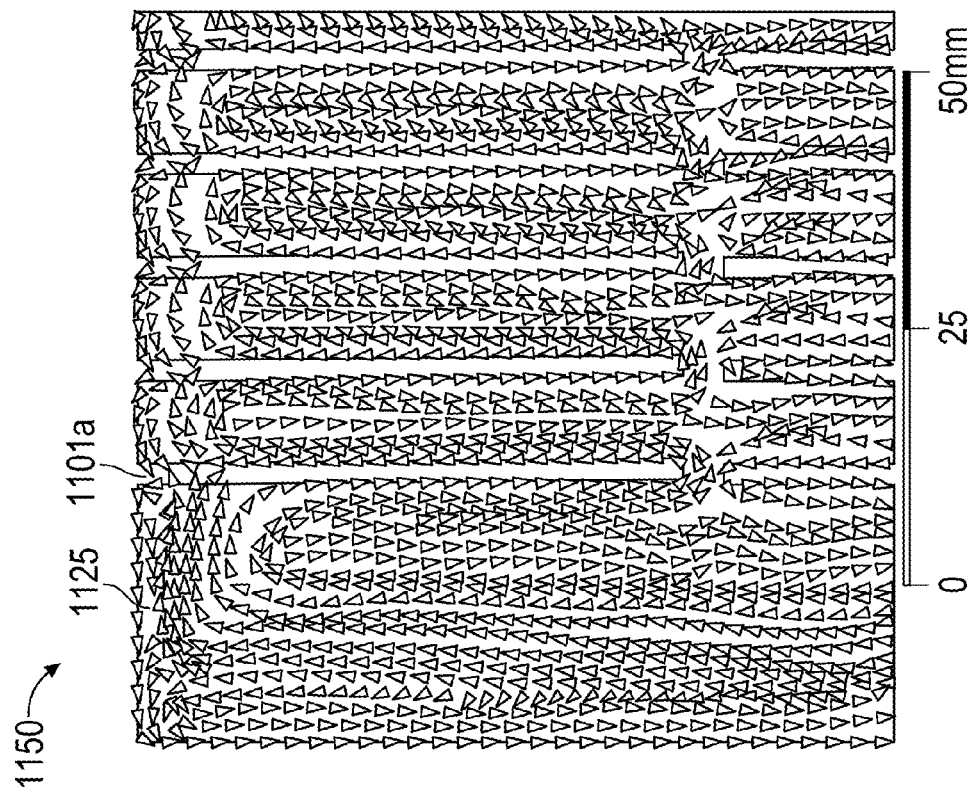
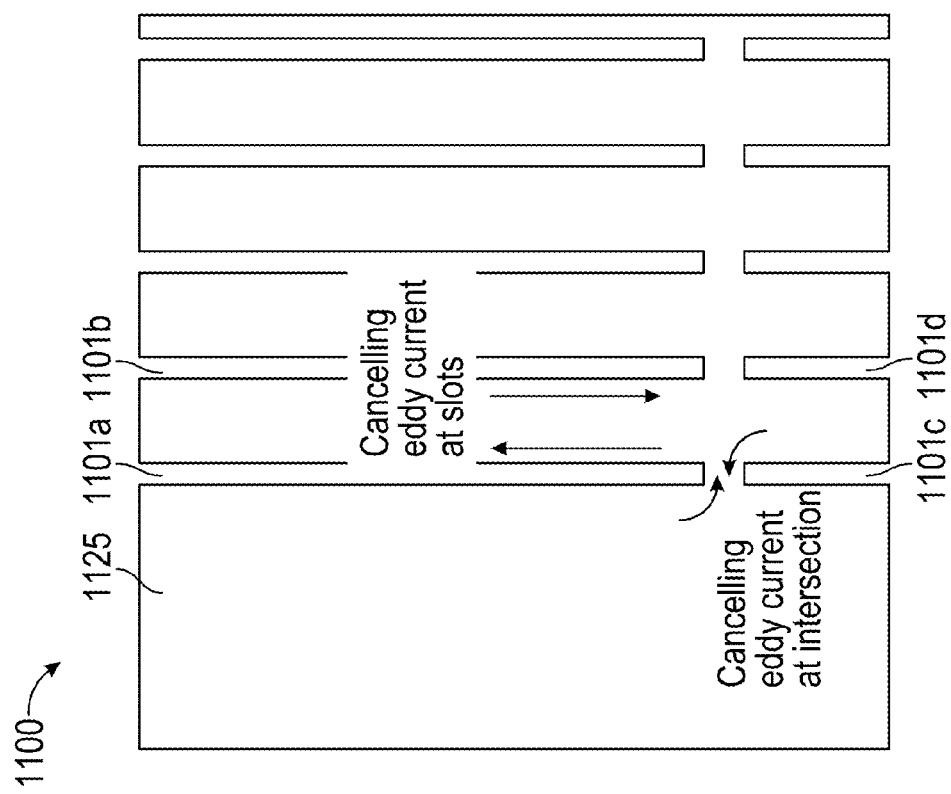
FIG. 11B
FIG. 11A

APPARATUS AND METHODS FOR SHIELDING A WIRELESS POWER TRANSMITTER

CROSS REFERENCE TO RELATED APPLICATIONS

This application claims priority under 35 U.S.C. § 119(e) to U.S. Provisional Patent Application No. 62/219,932 entitled "APPARATUS AND METHODS FOR SHIELDING WIRELESS POWER TRANSMITTER," filed on Sep. 17, 2015, the contents of which are hereby incorporated by reference in their entirety.

FIELD

The present disclosure relates generally to an electromagnetic shield for a wireless power transmitter.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the subject matter described in the disclosure provides an apparatus for wirelessly transmitting power. The apparatus includes a first metal sheet having a shape that defines a plurality of slots, the plurality of slots inwardly extending from a periphery of the first metal sheet. The apparatus further includes a coil configured to generate a magnetic field sufficient to charge or power a load, wherein the first metal sheet extends over a width and a length of the coil and wherein the plurality of slots are configured to at least partially cancel eddy currents generated in the first metal sheet via the magnetic field.

Another aspect of the subject matter described in the disclosure provides an implementation of a method of shielding a wireless power transmitter. The method includes positioning a first metal sheet comprising a plurality of slots relative to a coil, such that the first metal sheet extends over a width and a length of the coil, the plurality of slots inwardly extending from a periphery of the first metal sheet, wherein the coil is configured to generate a magnetic field sufficient to charge or power a load, and wherein the plurality of slots are configured to at least partially cancel eddy currents generated in the first metal sheet via the magnetic field.

Another aspect of the subject matter described in the disclosure provides an implementation of an apparatus for wireless transmitting power. The apparatus includes means for generating a magnetic field sufficient to charge or power a load. The apparatus further includes a first means for shielding the generating means, comprising means for canceling eddy currents generated in the first means for shielding via the magnetic field.

Another aspect of the subject matter described in the disclosure provides an implementation of an apparatus for wireless transmitting power. The apparatus includes a first metal sheet having a shape that defines a plurality of slots. The apparatus further includes a coil configured to generate a magnetic field sufficient to charge or power a load, wherein the first metal sheet extends over a width and a length of the coil, wherein the coil comprises a coil loop along a first plane, wherein the plurality of slots overlap at least a portion of the coil loop wherein the plurality of slots are configured to at least partially cancel eddy currents generated in the first metal sheet via the magnetic field

BRIEF DESCRIPTION OF THE DRAWINGS

FIG. 11A is a diagram illustrating a cancelling effect of eddy currents within a metal sheet using slots in accordance with an embodiment.

FIG. 11B is a diagram illustrating the direction of eddy currents generated in a metal sheet in accordance with an embodiment.

Figure 1:
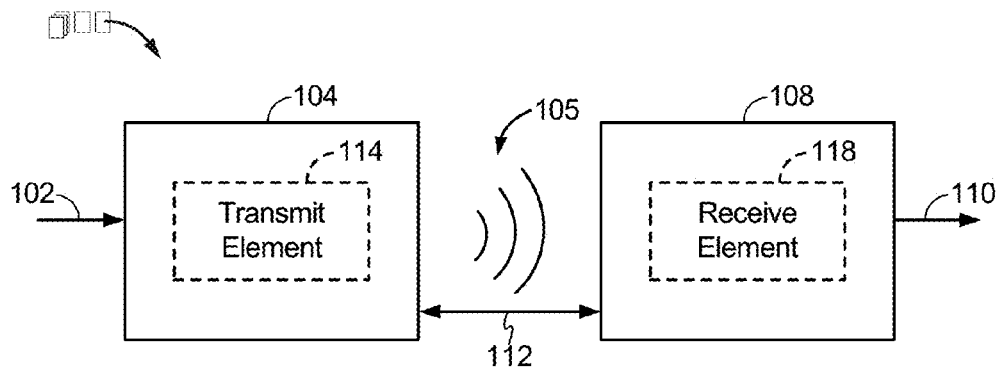
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) may be received, captured by, or coupled by a "power receiving element" to achieve power transfer.

FIG. 1 is a functional block diagram of a wireless power transfer system 100, in accordance with an illustrative embodiment. Input power 102 may be provided to a transmitter 104 from a power source (not shown in this figure) to generate a wireless (e.g., magnetic or electromagnetic) field 105 for performing energy transfer. A receiver 108 may couple to the wireless field 105 and generate output power 110 for storing or consumption by a device (not shown in this figure) coupled to the output power 110. The transmitter 104 and the receiver 108 may be separated by a distance 112. The transmitter 104 may include a power transmitting element 114 for transmitting/coupling energy to the receiver 108. The receiver 108 may include a power receiving element 118 for receiving or capturing/coupling energy transmitted from the transmitter 104.

In one illustrative embodiment, the transmitter 104 and the receiver 108 may be configured according to a mutual resonant relationship. When the resonant frequency of the receiver 108 and the resonant frequency of the transmitter 104 are substantially the same or very close, transmission losses between the transmitter 104 and the receiver 108 are reduced. As such, wireless power transfer may be provided over larger distances. Resonant inductive coupling techniques may thus allow for improved efficiency and power transfer over various distances and with a variety of inductive power transmitting and receiving element configurations.

In certain embodiments, the wireless field 105 may correspond to the "near field" of the transmitter 104 as will be further described below. The near-field may correspond to a region in which there are strong reactive fields resulting from the currents and charges in the power transmitting element 114 that minimally radiate power away from the power transmitting element 114. The near-field may correspond to a region that is within about one wavelength (or a fraction thereof) of the power transmitting element 114.

In certain embodiments, efficient energy transfer may occur by coupling a large portion of the energy in the wireless field 105 to the power receiving element 118 rather than propagating most of the energy in an electromagnetic wave to the far field.

In certain implementations, the transmitter 104 may output a time varying magnetic (or electromagnetic) field with a frequency corresponding to the resonant frequency of the power transmitting element 114. When the receiver 108 is within the wireless field 105, the time varying magnetic (or electromagnetic) field may induce a current in the power receiving element 118. As described above, if the power receiving element 118 is configured as a resonant circuit to resonate at the frequency of the power transmitting element 114, energy may be efficiently transferred. An alternating current (AC) signal induced in the power receiving element 118 may be rectified to produce a direct current (DC) signal that may be provided to charge or to power a load.

Figure 2:
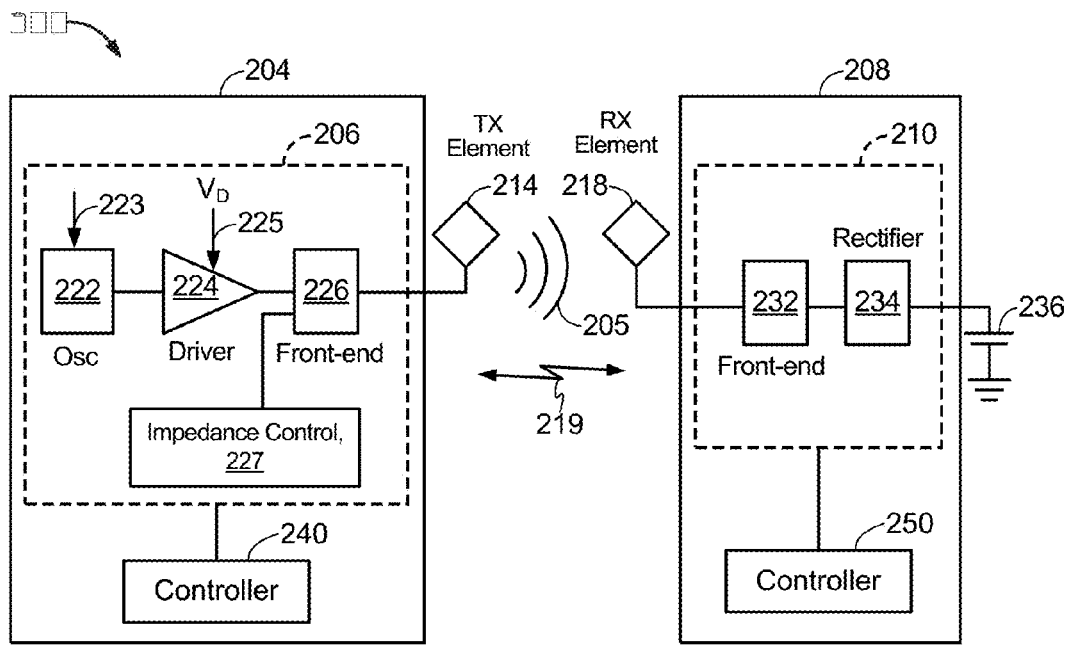
FIG. 2 is a functional block diagram of exemplary components that may be used in the wireless power transfer system of FIG. 1, in accordance with various exemplary embodiments of the invention.

FIG. 2 is a functional block diagram of a wireless power transfer system 200, in accordance with another illustrative embodiment. The system 200 may include a transmitter 204 and a receiver 208. The transmitter 204 (also referred to herein as power transmitting unit, PTU) may include transmit circuitry 206 that may include an oscillator 222, a driver circuit 224, a front-end circuit 226, and an impedance control module 227. The oscillator 222 may be configured to generate a signal at a desired frequency that may adjust in response to a frequency control signal 223. The oscillator 222 may provide the oscillator signal to the driver circuit 224. The driver circuit 224 may be configured to drive the power transmitting element 214 at, for example, a resonant frequency of the power transmitting element 214 based on an input voltage signal (VD) 225. The driver circuit 224 may be a switching amplifier configured to receive a square wave from the oscillator 222 and output a sine wave.

The front-end circuit 226 may include a filter circuit to filter out harmonics or other unwanted frequencies. The front-end circuit 226 may include a matching circuit to match the impedance of the transmitter 204 to the power transmitting element 214. As will be explained in more detail below, the front-end circuit 226 may include a tuning circuit to create a resonant circuit with the power transmitting element 214. As a result of driving the power transmitting element 214, the power transmitting element 214 may generate a wireless field 205 to wirelessly output power at a level sufficient for charging a battery 236, or otherwise powering a load. The impedance control module 227 may control the front-end circuit 226.

The transmitter 204 may further include a controller 240 operably coupled to the transmit circuitry 206 configured to control one or aspects of the transmit circuitry 206 or accomplish other operations relevant to managing the transfer of power. The controller 240 may be a micro-controller or a processor. The controller 240 may be implemented as an application-specific integrated circuit (ASIC). The controller 240 may be operably connected, directly or indirectly, to each component of the transmit circuitry 206. The controller 240 may be further configured to receive information from each of the components of the transmit circuitry 206 and perform calculations based on the received information. The controller 240 may be configured to generate control signals (e.g., signal 223) for each of the components that may adjust the operation of that component. As such, the controller 240 may be configured to adjust or manage the power transfer based on a result of the operations performed by it. The transmitter 204 may further include a memory (not shown) configured to store data, for example, such as instructions for causing the controller 240 to perform particular functions, such as those related to management of wireless power transfer.

The receiver 208 (also referred to herein as power receiving unit, PRU) may include receive circuitry 210 that may include a front-end circuit 232 and a rectifier circuit 234. The front-end circuit 232 may include matching circuitry to match the impedance of the receive circuitry 210 to the power receiving element 218. As will be explained below, the front-end circuit 232 may further include a tuning circuit to create a resonant circuit with the power receiving element 218. The rectifier circuit 234 may generate a DC power output from an AC power input to charge the battery 236, as shown in FIG. 2. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205.

The receiver 208 may be configured to determine whether an amount of power transmitted by the transmitter 204 and received by the receiver 208 is appropriate for charging the battery 236. Transmitter 204 may be configured to generate a predominantly non-radiative field with a direct field coupling coefficient (k) for providing energy transfer. Receiver 208 may directly couple to the wireless field 205 and may generate an output power for storing or consumption by a battery (or load) 236 coupled to the output or receive circuitry 210.

The receiver 208 may further include a controller 250 configured similarly to the transmit controller 240 as described above for managing one or more aspects of the wireless power receiver. The receiver 208 may further include a memory (not shown) configured to store data, for example, such as instructions for causing the controller 250 to perform particular functions, such as those related to management of wireless power transfer.

As discussed above, transmitter 204 and receiver 208 may be separated by a distance and may be configured according to a mutual resonant relationship to minimize transmission losses between the transmitter and the receiver.

Figure 3:
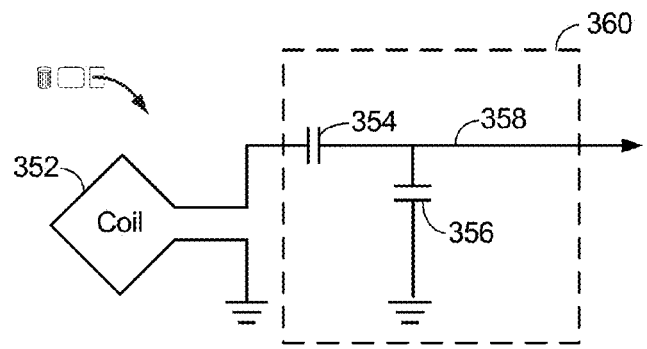
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of the transmit circuitry 206 or the receive circuitry 210 of FIG. 2, in accordance with illustrative embodiments. As illustrated in FIG. 3, transmit or receive circuitry 350 may include a power transmitting or receiving element 352 and a tuning circuit 360. The power transmitting or receiving element 352 may also be referred to or be configured as an antenna or a "loop" antenna. The term "antenna" generally refers to a component that may wirelessly output or receive energy for coupling to another "antenna." The power transmitting or receiving element 352 may also be referred to herein or be configured as a "magnetic" antenna, or an induction coil, a resonator, or a portion of a resonator. The power transmitting or receiving element 352 may also be referred to as a coil or resonator of a type that is configured to wirelessly output or receive power. As used herein, the power transmitting or receiving element 352 is an example of a "power transfer component" of a type that is configured to wirelessly output and/or receive power. The power transmitting or receiving element 352 may include an air core or a physical core such as a ferrite core (not shown in this figure).

When the power transmitting or receiving element 352 is configured as a resonant circuit or resonator with tuning circuit 360, the resonant frequency of the power transmitting or receiving element 352 may be based on the inductance and capacitance. Inductance may be simply the inductance created by a coil or other inductor forming the power transmitting or receiving element 352. Capacitance (e.g., a capacitor) may be provided by the tuning circuit 360 to create a resonant structure at a desired resonant frequency. As a non-limiting example, the tuning circuit 360 may comprise a capacitor 354 and a capacitor 356 may be added to the transmit and/or receive circuitry 350 to create a resonant circuit.

The tuning circuit 360 may include other components to form a resonant circuit with the power transmitting or receiving element 352. As another non-limiting example, the tuning circuit 360 may include a capacitor (not shown) placed in parallel between the two terminals of the circuitry 350. Still other designs are possible. In some embodiments, the tuning circuit in the front-end circuit 226 may have the same design (e.g., 360) as the tuning circuit in front-end circuit 232. In other embodiments, the front-end circuit 226 may use a tuning circuit design different than in the front-end circuit 232.

For power transmitting elements, the signal 358, with a frequency that substantially corresponds to the resonant frequency of the power transmitting or receiving element 352, may be an input to the power transmitting or receiving element 352. For power receiving elements, the signal 358, with a frequency that substantially corresponds to the resonant frequency of the power transmitting or receiving element 352, may be an output from the power transmitting or receiving element 352. Embodiments and descriptions provided herein may be applied to resonant and non-resonant implementations (e.g., resonant and non-resonant circuits for power transmitting or receiving elements and resonant and non-resonant systems).

In some embodiments, a metal or foreign object located on or near a wireless power transfer system (e.g., wireless power transfer system 100, 200) may negatively affect wireless power transfer in the system. For example, a metal object placed within a charging region of the wireless power transfer system 200 may cause the metal object heat up and cause damage to the wireless power transfer system 200 components as well as introduce efficiency losses. In another example, the power transmitting element 214 or the power receiving element 218 may be placed on a metal table or object which may alter the resonant frequency of the wireless power transfer system 200 and/or alter the wireless field 205. In some aspects, the effects of the metal table, metal or foreign object may disable the wireless power transfer system 200 and prevent wireless power transfer. Additionally, living objects (e.g., animals, humans, etc.) may be exposed to damaging electromagnetic fields that may cause injury to the living objects. In some aspects, it may be desirable to shield one or more of the power transmitting element 214 and the power receiving element 218 from the effects of the metal or foreign objects to avoid shifts in the resonant frequency, avoid losses, and increase efficiency of the wireless power transfer system 200. In some aspects, an electromagnetic shield may be placed above or below the power transmitting element 214 to shield it from the effects of the metal or foreign objects. In some embodiments, the shield may comprise a metal sheet with a plurality of slots etched out from the metal sheet. The slots may be configured to at least partially cancel eddy currents generated in the metal sheet (e.g., eddy currents formed in response to the magnetic field generated by the power transmitting element 214) and reduce or negate the effects of other metal or foreign objects placed within the proximity of the power transmitting element 214. Embodiments described herein relate to shielding a power transmitting element from the effects of metal or foreign objects. While examples described herein relate to power transmitting elements such embodiments and descriptions may also be applied to power receiving elements.

Figure 4A:
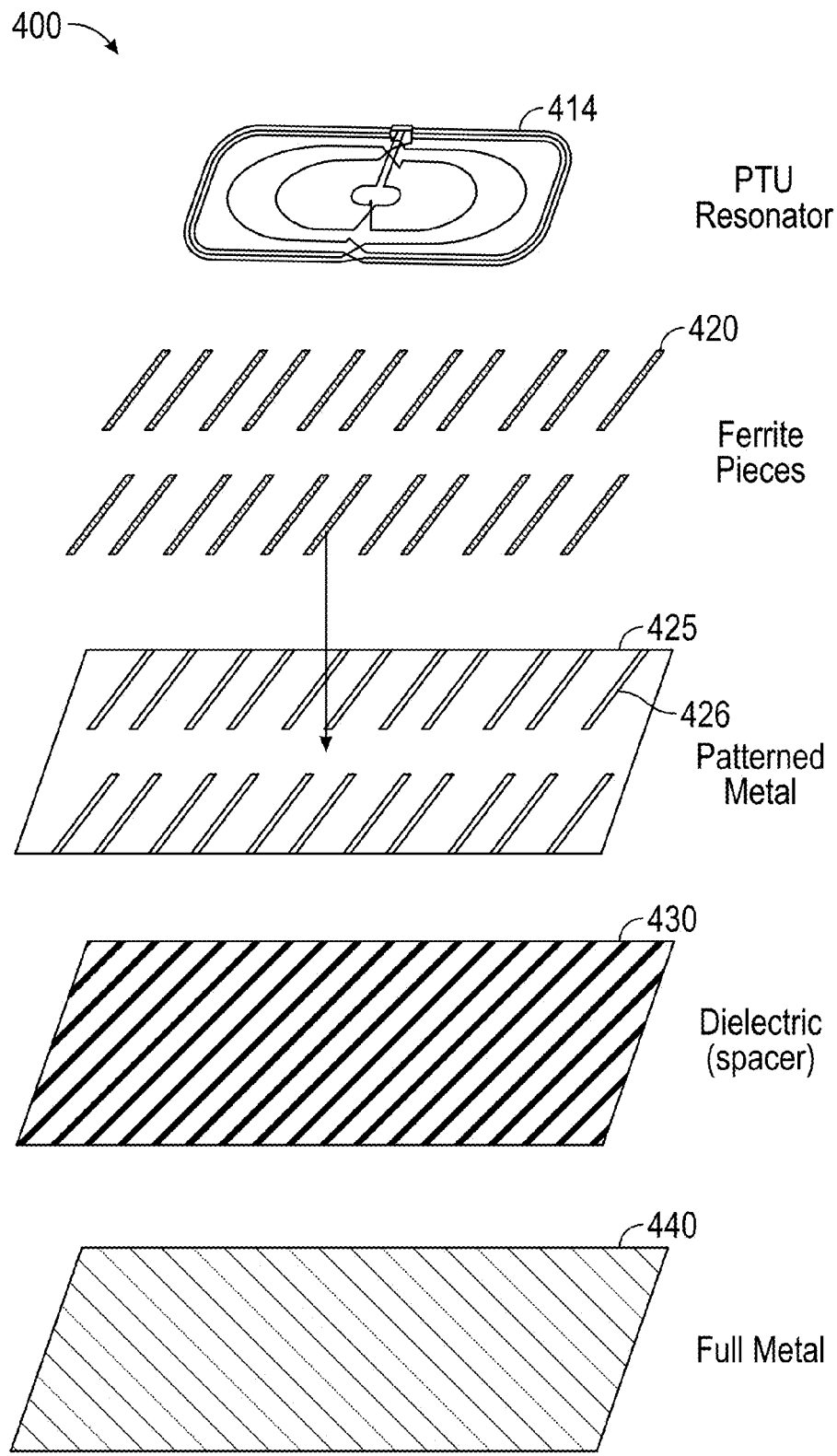
FIG. 4A is a diagram of an exemplary power transmitting element structure in accordance with an embodiment.

FIG. 4A is an exemplary exploded view diagram of a power transmitting element 400. As illustrated, the power transmitting element 400 comprises a resonator 414, one or more ferrite pieces 420, a patterned metal sheet 425, a dielectric sheet 430, and a full metal sheet 440. In some aspects, the resonator 414 may be similar to power transmitting element 214 of FIG. 2 and the power transmitting or receiving element 352 of FIG. 3. The resonator 414 may comprise an antenna or coil that may be configured in a coil loop configuration. In some aspects, the resonator 414 may be configured to generate a magnetic field sufficient to power or charge a load. In some aspects, the ferrite pieces 420 may comprise any ferrite or magnetic material. For example, the ferrite pieces 420 may comprise iron, zinc, nickel, or any other ferromagnetic material. A non-limiting example of a ferromagnetic material includes materials that have a relative magnetic permeability $\mu_r$ of 2000 or above. Permeability is typically indicated by the constant, "$\mu$," or relative magnetic permeability, "$\mu_r$." As used herein, relative permeability, generally refers to the ratio of the permeability of a specific medium to the permeability of free space (a vacuum), $\mu_0$ ($\mu_r = \mu/\mu_0$).

As shown in FIG. 4A, the patterned metal sheet 425 may comprise a plurality of slots 426. The metal sheet 425 also may have a physical spacing from the resonator 414 in order to avoid shorting out the resonator 414. In some aspects, a plastic fixture can be built to implement the spacing. In some aspects, the spacing may be implemented by the dielectric sheet 430. The slots 426 may comprise an empty space within the patterned metal sheet 425 removed from the patterned metal sheet 425. In some aspects, the patterned metal sheet 425 may comprise a first metal sheet of the power transmitting element 400. In some aspects, the ferrite pieces 420 may be configured to match the patterned slots 426 of the patterned metal sheet 425. In some aspects, the ferrite pieces 420 may comprise a full ferrite sheet which may block the magnetic field of the resonator 414 but may add cost to the power transmitting element 400. The power transmitting element 400 may also comprise the dielectric sheet 430 below the patterned metal sheet 425. The dielectric sheet 430 may act as a spacer between the resonator 414 and the full metal sheet 440. In some aspects, the dielectric sheet 430 may be placed above the resonator 414 to act as a spacer between the resonator 414 and the patterned metal sheet 425. Additionally, in some embodiments, the full metal sheet 440 may be placed below the dielectric spacer 430. In some aspects, the full metal sheet 440 may comprise a second metal sheet of the power transmitting element 400.

In some embodiments, the power transmitting element 400 may comprise the patterned metal sheet 425 and the resonator 414 without the ferrite pieces 420 and/or without the full metal sheet 440. In some aspects, it may be desirable to exclude the ferrite pieces 420 and/or the full metal sheet 440. For example, in order to reduce costs for the power transmitting element 400, the ferrite pieces 420 may be removed. Additionally, if the circuitry of the power transmitting element 400 may tolerate a larger variety of voltages and currents, then the full metal sheet 440 and/or the ferrite pieces 420 may not be necessary and may reduce weight, complexity, etc. In some aspects, the full metal sheet 440 may degrade performance or efficiency of the power transmitting element 400, but may also reduce variability of inductance changes of the power transmitting element 400 in response to additional metal or foreign objects located in the vicinity of the power transmitting element 400. For example, the power transmitting element 400 may be tuned to account for the effect of the full metal sheet 440 and further variation may be reduced.

Figure 4B:
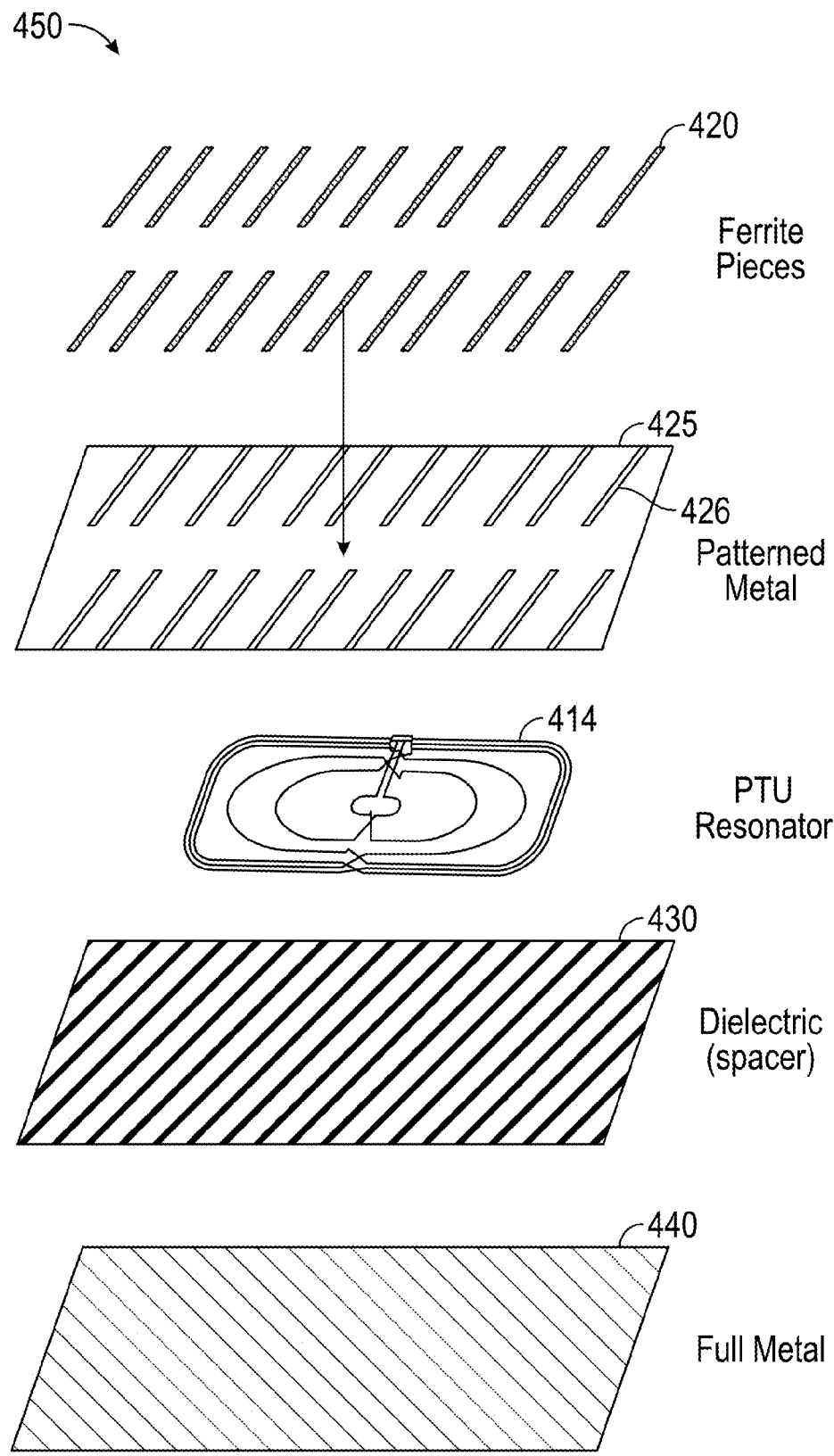
FIG. 4B is a diagram of another exemplary power transmitting element structure in accordance with an embodiment.

FIG. 4B is an exploded view of another exemplary power transmitting element 450. The power transmitting element 450, as shown in FIG. 4B, comprises the same components as the power transmitting element 400 of FIG. 4A. Only differences between the power transmitting element 450 of FIG. 4B and the power transmitting element 400 of FIG. 4A are discussed herein for the sake of brevity. As shown in FIG. 4B, the ferrite pieces 420 are placed above the patterned metal sheet 425. Additionally, the patterned metal sheet 425 is placed on a first side of (above) the resonator 414 and the dielectric spacer 430 is placed on a second side of (below) the resonator 414. In FIG. 4B, the full metal sheet 440 is located on the second side (below) the dielectric spacer 430. While not shown in FIGS. 4A and 4B, the dielectric spacer 430 may also be placed on a first side of the metal sheet (e.g., between the patterned metal sheet 425 and the resonator 414) in addition to or instead of the dielectric spacer 430 placed on the second side (below) the resonator 414. Additionally, while not shown in FIGS. 4A and 4B, the patterned metal sheet 425 may be placed both sides (above and below) the resonator 414. In some aspects, a patterned metal sheet 425 placed above the resonator 414 may comprise a first metal sheet, the full metal sheet 440 may comprise a second metal sheet, and a patterned metal sheet 425 placed below the resonator 414 may comprise a third metal sheet of the power transmitting element 450.

Figure 5A:
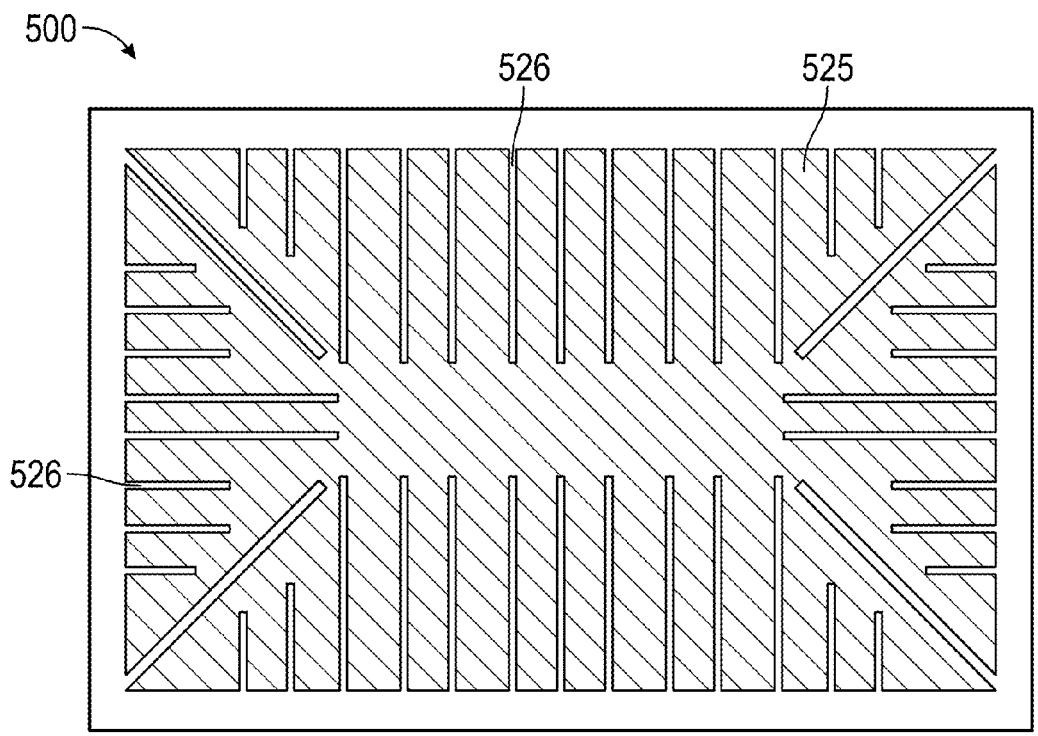
FIG. 5A is a diagram of an exemplary electromagnetic shield in accordance with an embodiment.

FIG. 5A illustrates an exemplary electromagnetic shield 500. The electromagnetic shield 500 comprises a metal sheet 525 and a plurality of slots 526 within the metal sheet 525. In some aspects, the metal sheet 525 and plurality of slots 526 may be similar to the patterned metal sheet 425 and plurality of slots 426 of FIGS. 4A and 4B. As discussed above with respect to FIGS. 4A and 4B, the slots 526 may comprise empty spaces within the metal sheet 525 and may be cut out or removed from the metal sheet 525. As shown in FIG. 5A, the slots 526 extend from the periphery of the metal sheet 525 towards the center of the metal sheet 525. In some aspects, the metal sheet 525 comprises a single sheet. In some embodiments, the slots 526 are configured to be perpendicular to a resonator coil (e.g., resonator 414 of FIGS. 4A and 4B) of a power transmitting element (e.g., power transmitting elements 400 or 450 of FIGS. 4A and 4B). In some aspects, such a configuration may reduce, partially cancel, or fully cancel eddy currents in the metal sheet 525 and/or at least partially cancel eddy currents in nearby metal or foreign objects (e.g., eddy currents formed in response to a magnetic field, such as that generated by resonator 414). Additionally, with respect to FIGS. 4A and 4B, the metal sheet 525 (e.g., patterned metal sheet 425) may also prevent or reduce eddy currents from being generated in the full metal sheet 440. For example, with reference to FIGS. 11A and 11B described in more detail below, eddy currents may be cancelled between slots 1101a and 1101b due to the current flow between the slots 1101a and 1101b. Additionally, eddy currents may be cancelled between slots 1101a and 1101c due to the interaction and current flow between the slots 1101a and 1101c. In some embodiments, it may be beneficial to increase or decrease the space between the slots 526 (also slots 1101a and 1101b of FIG. 11A) or extend or decrease the length of the slots 526 (also slots 1101a and 1101c of FIG. 11A).

Figure 5B:
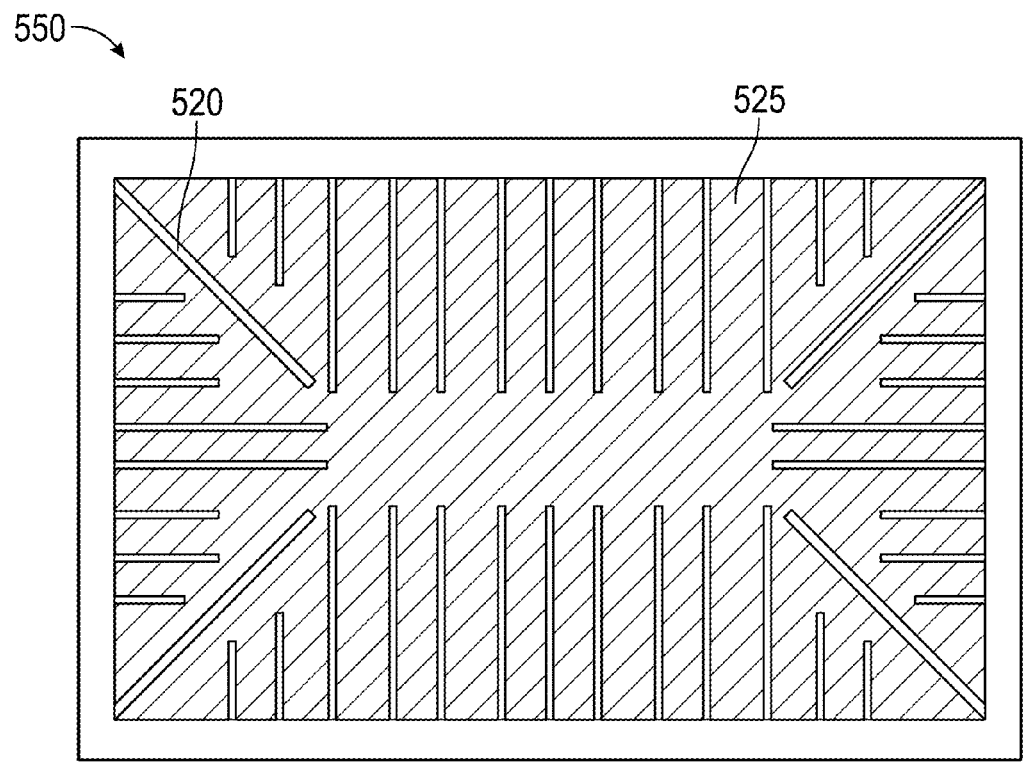
FIG. 5B is a diagram of another exemplary electromagnetic shield in accordance with an embodiment.

FIG. 5B illustrates another exemplary electromagnetic shield 550. The electromagnetic shield 550 is similar to and adapted from the electromagnetic shield 500 of FIG. 5A. Only differences between the electromagnetic shield 550 and the electromagnetic shield 500 are discussed herein for the sake of brevity. The electromagnetic shield 550 further comprises ferrite pieces 520 as shown in FIG. 5B. In FIG. 5B, the ferrite pieces 520 are located on top of or within the slots 526 of FIG. 5A. In some aspects, the ferrite material is an optional addition to the electromagnetic shield 550. In some aspects, the ferrite pieces 520 may be utilized to increase isolation between any metal or foreign objects located under or near the power transmitting element 400 of FIG. 4A and FIG. 4B. For example, the ferrite pieces 520 may block the magnetic field (H field) generated by a resonator (e.g., resonator 414 of FIGS. 4A and 4B). The ferrite pieces 520 may block or confine the magnetic field by providing a low-reluctance path for the magnetic flux which can effectively guide the magnetic flux along the ferrite pieces 520 while still allowing the eddy current cancelling benefits of the metal sheet 525.

Figure 5C:
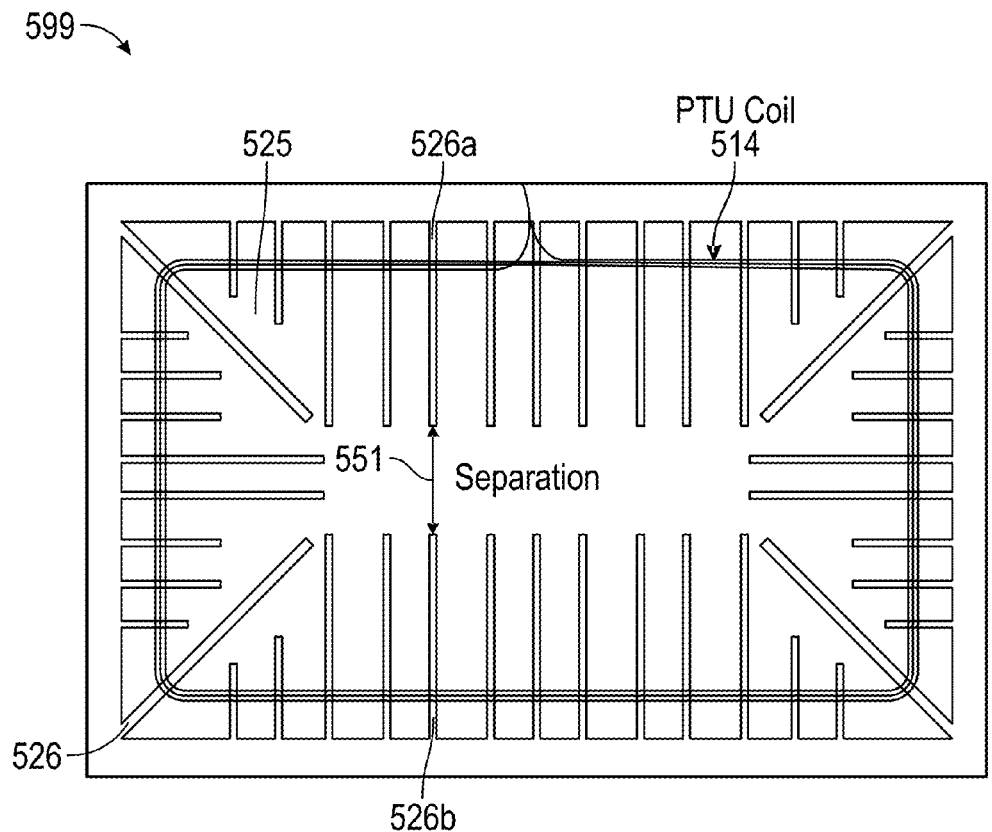
FIG. 5C is a diagram of another exemplary power transmitting element structure in accordance with an embodiment.

FIG. 5C is an exemplary embodiment of a power transmitting element 599. Power transmitting element 599 comprises a resonator coil 514 and a patterned metal sheet 525 placed above or below the resonator coil 414. As shown in FIG. 5C, the metal sheet 525 comprises a plurality of slots 526 and illustrates a separation distance 551 in the middle of the metal sheet 525 between the slots 526a and 526b. As discussed above, in some aspects it may be beneficial to increase or decrease the separation distance 551. For example, in some aspects, in order to at least partially cancel the eddy currents generated within the metal sheet 525 it may be beneficial to reduce the separation distance 551 between the slots 526a and 526b as well as the other slots 526.

Figure 6A:
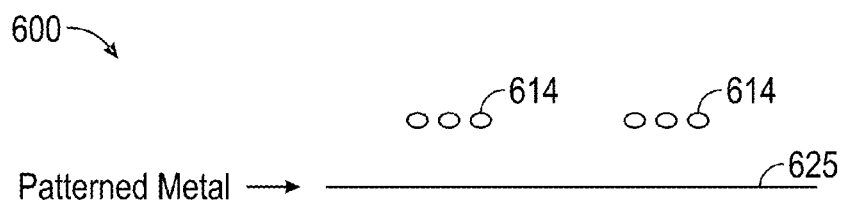
FIG. 6A is a cross-sectional diagram of another exemplary power transmitting element structure in accordance with an embodiment.

FIG. 6A is a cross-sectional diagram of an exemplary power transmitting element 600. As shown, the power transmitting element 600 comprises a resonator coil 614 and a patterned metal sheet 625 located below the resonator coil 614. While not shown in FIG. 6A, the pattern metal sheet 625 may also be placed above the resonator coil 614. In some aspects, the patterned metal sheet 625 may comprise a plurality of slots similar to the slots 526 of FIGS. 5A and 5C, above. Additionally, the patterned metal sheet 625 may comprise a metal sheet similar to the patterned metal sheet 425 of FIGS. 4A and 4B and the metal sheet 525 of FIGS. 5A-5C.

Figures 6B, 7:
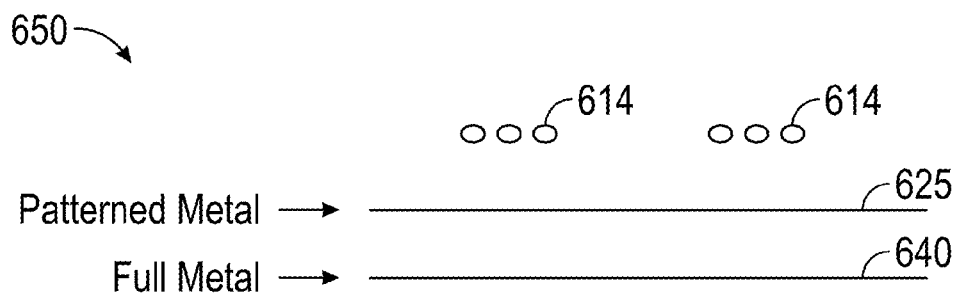
FIG. 6B is a cross-sectional diagram of another exemplary power transmitting element structure in accordance with an embodiment.
FIG. 7 is a chart of exemplary values generated by different configurations for a power transmitting element, in accordance with embodiments described herein.

FIG. 6B is a cross-sectional diagram of another power transmitting element 650. Power transmitting element 650 is similar to and adapted from the power transmitting element 600 of FIG. 6A. Only differences between the power transmitting element 650 and the power transmitting element 600 are discussed herein for the sake of reference. The power transmitting element 650 further comprises a full metal sheet 640 placed below the patterned metal sheet 625. In some aspects, the full metal sheet 640 may be identical or similar to the full metal sheet 440 of FIGS. 4A and 4B. As discussed above, the presence of the pattern metal sheet 625 may reduce or cancel the negative effects of the full metal sheet 640 placed in proximity to the resonator coil 614. In other aspects, the full metal sheet 640 may comprise a component of the power transmitting element 650 may provide additional protection against further metal objects or foreign objects placed in proximity to the power transmitting element 650. For example, the presence of the patterned metal sheet 625 and the full metal sheet 640 may be accounted for by the power transmitting element 650 and the resonator coil 614 may be tuned to account for the effects of the patterned metal sheet 625 and the full metal sheet 640. Such tuning may be beneficial because additional metal or foreign objects placed in the vicinity of the power transmitting element 650 may have a negligible effect on the power transmitting element 650.

FIG. 7 is a chart 700 of exemplary values generated by different configurations for a power transmitting element (e.g., power transmitting element 400). Row 1 of the chart 700 illustrates values for a power transmitting element configuration comprising a resonator coil (e.g., resonator 414) placed in the vicinity of a full metal table separate from the power transmitting element. In some embodiments, the full metal table may comprise the full metal sheet 440 of FIGS. 4A and 4B or the full metal sheet 640 of FIG. 6B. As shown in FIG. 7, the configuration in row 1 results in a transmitter inductance of 2.3 µH at a resistance of 1.4 ohms. On the receiver side, a power receiving element may receive an inductance of 1445 nH with a resistance of 0.7 ohms. Row 2 of chart 700 illustrates values for a power transmitting element configuration comprising a resonator coil, a pattern metal sheet comprising a plurality of slots placed in the vicinity of a full metal sheet. In some embodiments, the power transmitting element configuration in Row 2 may comprise the configuration of power transmitting element 650 of FIG. 6B. At the power transmitting element (e.g., power transmitting element 650), the power transmitting element has an inductance of 2.5 µH with a resistance of 1.4 ohms. At a power receiving element, e.g., power receiving element 218 of FIG. 2, the power receiving element has an inductance of 1475 nH with a resistance of 0.7 ohms. In Row 3 of chart 700, a power transmitting element comprises a resonator coil and an electromagnetic shield comprising segments of metal material located above or below the resonator coil. In contrast to the patterned metal sheet 425, 525, and 625 of FIGS. 4A, 4B, 5A-5C, 6A and 6B, the electromagnetic shield of Row 3 comprises multiple metal pieces with complete electrical isolation. The power transmitting element of Row 3 is also placed in the vicinity of a separate full metal sheet or full metal table. As shown in Row 3 of FIG. 7, the transmitter may have an inductance of 2.4 µH with a resistance of 1.4 ohms. At the power receiving elements in row 3 has an inductance of 1460 nH with a resistance of 0.7 ohms. In the exemplary configurations of FIG. 7, the mutual inductance in row 2 represents a 63% improvement from the mutual inductance of the configuration in row 1.

Figure 8B:
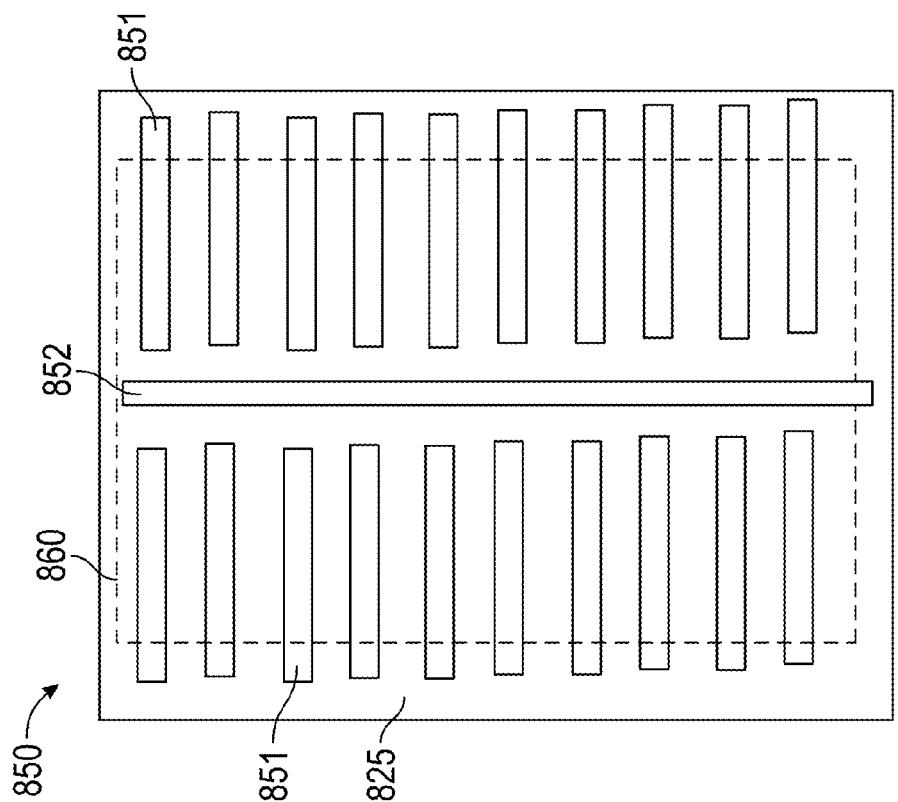
FIG. 8B is a diagram of another exemplary electromagnetic shield in accordance with an embodiment.
Figure 8A:
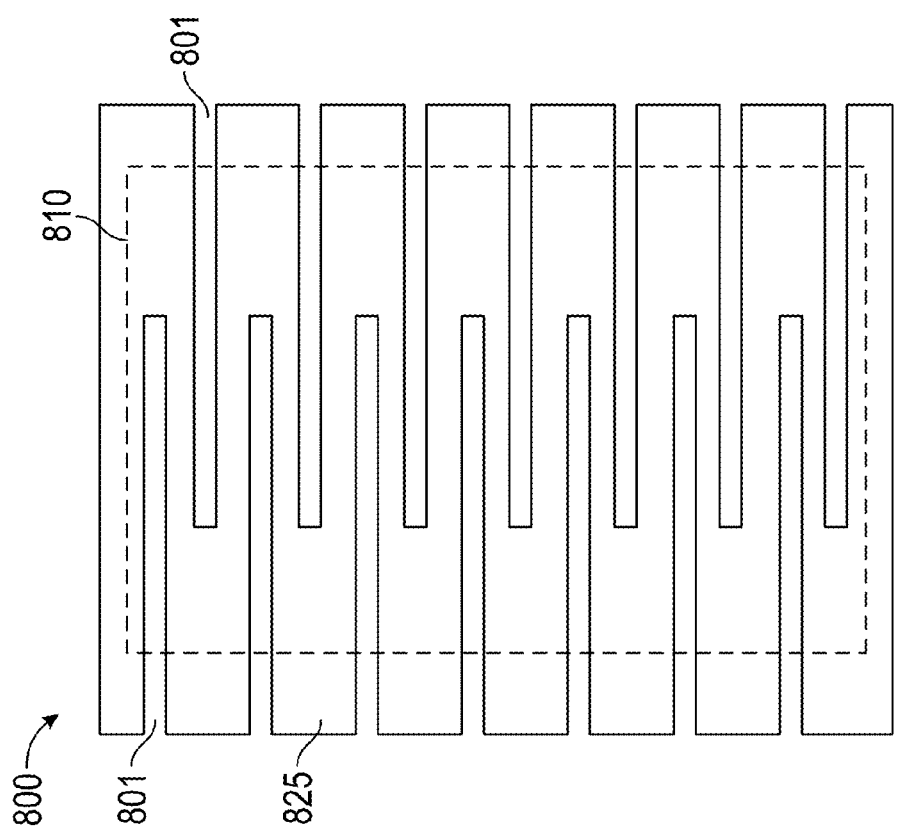
FIG. 8A is a diagram of another exemplary electromagnetic shield in accordance with an embodiment.

FIG. 8A is a diagram of an exemplary electromagnetic shield 800. The electromagnetic shield 800 comprises a plurality of slots 801 and a metal sheet 825. As shown in FIG. 8A, the slots 801 extend horizontally from the periphery metal sheet 825 and the slots 801 overlap vertically within the region 810 of the metal sheet 825. FIG. 8B is a diagram of another exemplary electromagnetic shield 850. The electromagnetic shield 850 comprises a plurality of slots 851 and a center slot 852. The electromagnetic shield 850 also comprises the metal sheet 825. As shown in FIG. 8B, the slots 851 are positioned horizontally within the metal sheet 825 and are located on either side of the center slot 852 which extends vertically within the metal sheet 825. In some aspects, the electromagnetic shield 850 represents a shorted slot configuration for the electromagnetic shield 850. In some aspects, the slots 801, 851, and 852 may also include ferrite material added over or within the slots 801, 851, and 852.

Figure 9B:
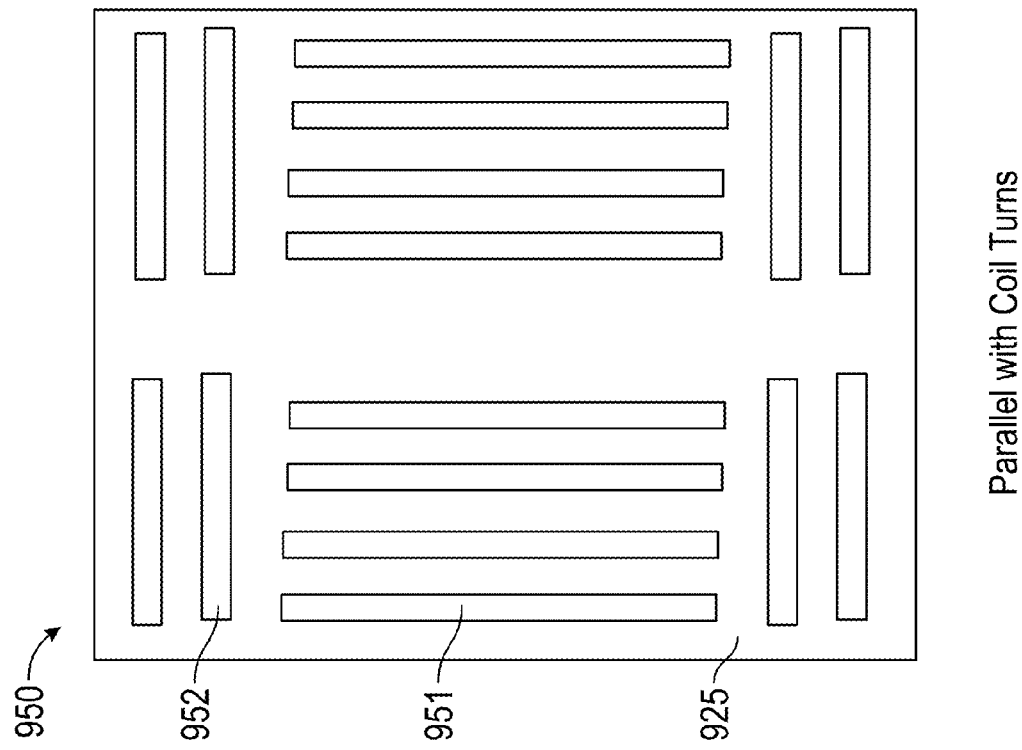
FIG. 9B is a diagram of another exemplary electromagnetic shield in accordance with an embodiment.
Figure 9A:
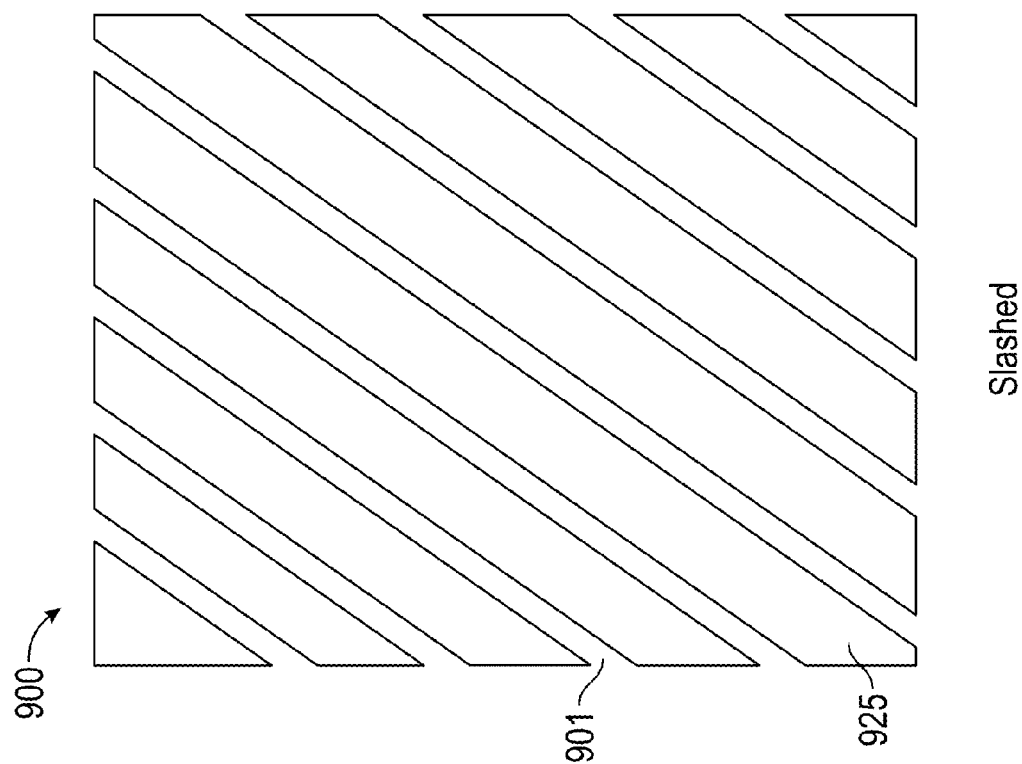
FIG. 9A is a diagram of another exemplary electromagnetic shield in accordance with an embodiment.

FIG. 9A is another exemplary embodiment of an electromagnetic shield 900 comprising ferrite material. The electromagnetic shield 900 comprises slots 901 and metal sheet 925. As shown in FIG. 9A, the slots 901 are configured in diagonal lines across the metal sheet 925. In some aspects, ferrite material (e.g., ferrite pieces 426 of FIGS. 4A and 4B) may be attached or spread out on the metal sheet 925. As shown in FIG. 9A, the slots 901 in FIG. 9A may include a portion of ferrite material to help shield the magnetic field generated by a resonator of a power transmitting element. While the slots 901 are shown as extending in a 45° angle from the sides of the metal sheet 925, other angles and configurations are possible. In some embodiments, the electromagnetic shield 900 may comprise the ferrite material without the metal sheet 925. In some aspects, the ferrite material may be configured in the shape of the slots shown in FIG. 9A. In other aspects, the ferrite material may be comprise a full ferrite sheet configured to at least partial extend over an area defined by the resonator (e.g., resonator 414).

FIG. 9B is an exemplary diagram of another electromagnetic shield 950. The electromagnetic shield 950 comprises the metal sheet 925 and a plurality of slots 951 and 952. As shown in FIG. 9B, the slots 952 extend horizontally within the metal sheet 925 and the slots 951 extend vertically within the metal sheet 925. In some aspects, the slots 951 and 952 are configured to run parallel with one or more coil turns of a resonator coil (e.g., resonator 414 of FIG. 4A and FIG. 4B for resonator coil 414 of FIG. 5C). As described above, the slots 951 and 952 may also include ferrite material added over or within the slots 951 and 952. Additionally, the electromagnetic shield 950 may comprise the ferrite material without the metal sheet 925. In such embodiments, the ferrite material may comprise ferrite material in the shape of the slots 951 and 952 or may comprise a full ferrite sheet.

Figure 10A:
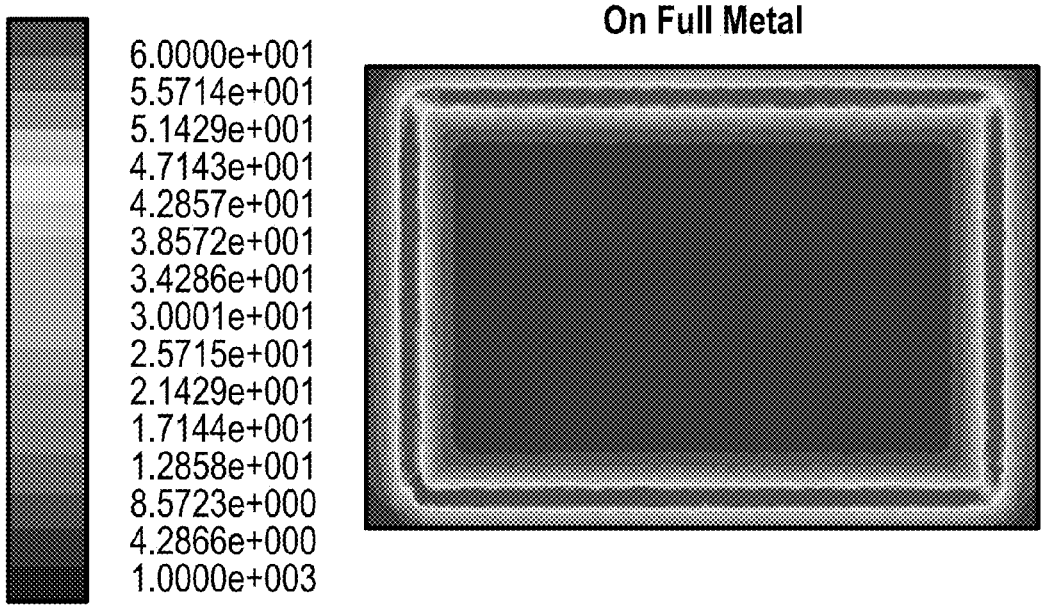
FIG. 10A is an exemplary simulation of a power transmitting element configuration when a full metal plate is located under the power transmitting element in accordance with an embodiment.
Figure 10B:
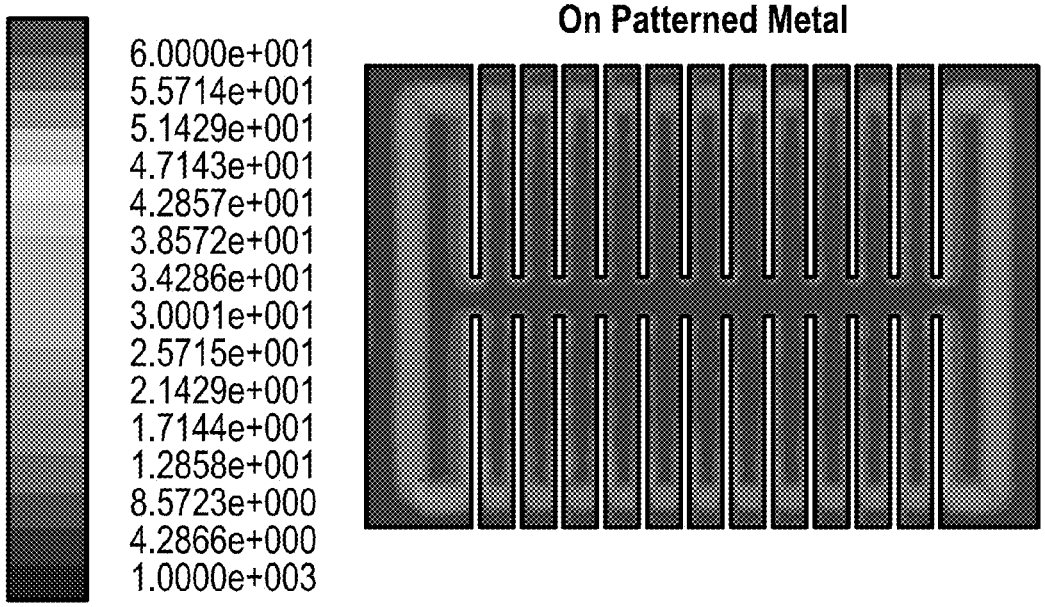
FIG. 10B is a simulation of a power transmitting element which comprises a patterned metal sheet in accordance with an embodiment.

FIG. 10A is an exemplary simulation of a power transmitting element configuration when a full metal plate is located under the power transmitting element. As shown in FIG. 10A, a greater amount of eddy current is generated near the location of the resonator coil 1014. FIG. 10B is a simulation of a power transmitting element which comprises a patterned metal sheet (e.g., patterned metal sheet 425 of FIGS. 4A and 4B). As shown in FIG. 10B, the amount of eddy current in the vicinity of the resonator coil 1014 and throughout the patterned metal sheet is reduced from that shown in FIG. 10A.

FIG. 11A is a diagram 1100 illustrating a cancelling effect of eddy currents within a metal sheet 1125 using slots 1101. As shown in FIG. 11A, the slots 1101 may be configured such that the eddy currents generated between the slots may be at least partially cancelled. For example, FIG. 11A shows that eddy currents flowing vertically upward to the immediate right of slot 1101a may be at least partially cancelled by the eddy currents flowing vertically downward to the immediate left of slot 1101b. Additionally, the eddy currents generated at the intersection or center of the metal sheet 1125 may also be reduced, partially or fully cancelled through the use of the slots 1101. For example, FIG. 11A shows that eddy currents flowing around the end of slot 1101a in a center portion of the metal sheet 1125 may be at least partially cancelled by the eddy currents flowing around the end of slot 1101c in the center portion.

FIG. 11B is a diagram 1150 illustrating the direction of eddy currents generated in the metal sheet 1125. As shown in FIG. 11B, the current between the slots 1101 may flow in opposite directions so as to cancel the effects of the eddy currents generated in the metal sheet 1125. As discussed above, this reduction or cancellation of the eddy currents generated in the metal sheet 1125 may increase efficiency of a wireless power transfer system (e.g., wireless power transfer systems 100 and 200 of FIGS. 1 and 2) and also increase isolation from a full metal sheet, metal table or other metal/foreign object.

Figure 12:
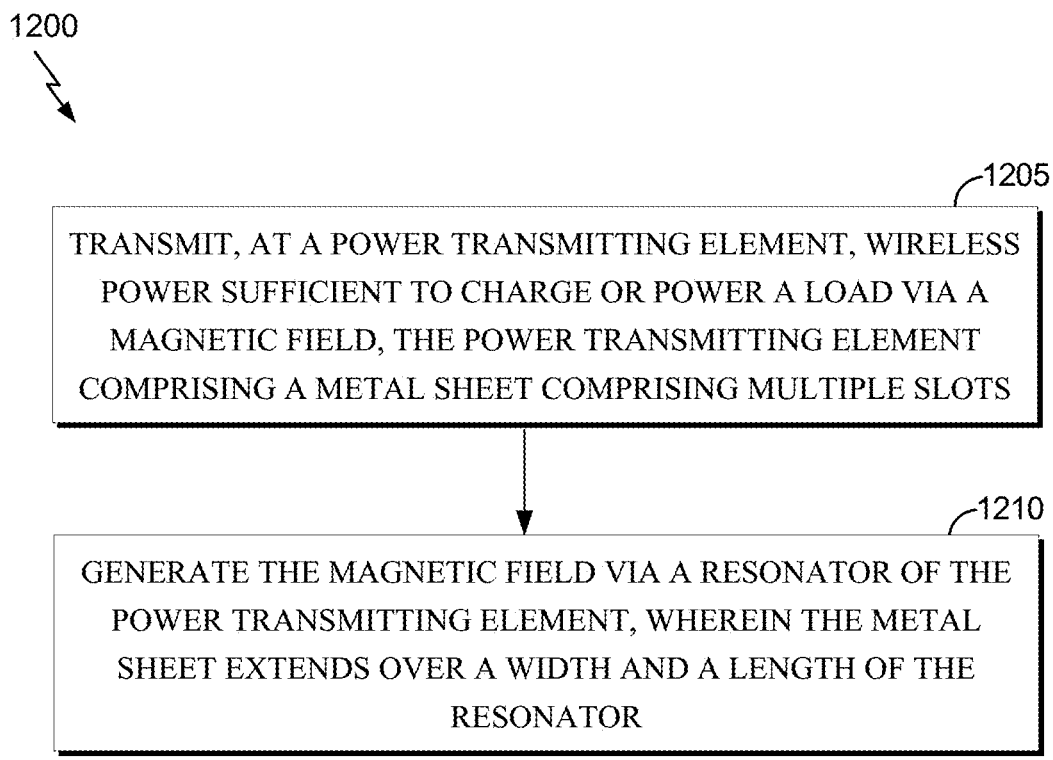
FIG. 12 is a flowchart of an exemplary method of transmitting wireless power in accordance with an embodiment.

FIG. 12 is a flowchart of an exemplary method 1200 of transmitting wireless power. The method 1200 shown in FIG. 12 may be implemented via one or more devices in the wireless power transfer system 100 and/or 200 similar to the power transmitting element 114, the power transmitting element 214, the transmit circuitry 350, the power transmitting element 400, 450, 599, 600, 650, of FIGS. 1-6B. Although the method 1200 is described herein with reference to a particular order, in various implementations, blocks herein may be performed in a different order, or omitted, and additional blocks may be added.

At block 1205, the method 1200 comprises transmitting, at a power transmitting element, wireless power sufficient to charge or power a load via a magnetic field, the power transmitting element comprising a metal sheet comprising multiple slots. The multiple slots of the metal sheet extending from a periphery of the metal sheet. At block 1210, the method 1200 further comprises generating the magnetic field via a resonator of the power transmitting element, wherein the metal sheet extends over a width and a length of the resonator.

In some aspects, the method 1200 may be implemented by an apparatus for wirelessly transmitting power. In some aspects, the apparatus comprises means for generating a magnetic field sufficient to charge or power a load. The apparatus further comprises a first means for shielding the generating means from a first metal sheet, the means for shielding defining a plurality of slots, the plurality of slots inwardly extending from a periphery of the first means for shielding, wherein the first means for shielding extends over a width and a length of the generating means and wherein the plurality of slots are configured to at least partially cancel eddy currents generated embodiments as described herein or in the first means for shielding via the magnetic field. In some aspects, the means for generating comprises the resonator coil 414 or 514. In some aspects, the first means for shielding comprises the patterned metal sheet 425, 525, 625, or 1125.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for wirelessly transmitting power, the apparatus comprising:
    a first metal sheet having a shape that defines a plurality of slots, the plurality of slots inwardly extending from a periphery of the first metal sheet, the shape of the first metal sheet defined at least by a first slot inwardly extending from a side of the periphery, a second slot inwardly extending from the side of the periphery, and a third slot inwardly extending from the side of the periphery; and
    a coil, wherein the first metal sheet extends over a width and a length of the coil and wherein the plurality of slots are positioned relative to one another to at least partially cancel eddy currents generated in the first metal sheet in response to a magnetic field generated by the coil to charge or power a load, wherein based on a position of the first slot and the second slot, a first eddy current component, that flows in the first metal sheet between the first slot and the second slot in response to the magnetic field, flows in an opposite direction relative to a second eddy current component that flows in the first metal sheet between the first slot and the second slot to partially cancel the eddy currents in the first metal sheet between the first slot and the second slot, wherein based on a position of the second slot and the third slot, a third eddy current component, that flows in the first metal sheet between the second slot and the third slot in response to the magnetic field, flows in an opposite direction relative to a fourth eddy current component that flows in the first metal sheet between the second slot and the third slot to partially cancel the eddy currents in the first metal sheet between the second slot and the third slot.

2. The apparatus of claim 1, further comprising one or more ferrite pieces.

3. The apparatus of claim 2, wherein the one or more ferrite pieces are placed within or match a shape of the plurality of slots.

4. The apparatus of claim 1, further comprising a second metal sheet, wherein the first metal sheet is located on a first side of the coil and the second metal sheet is located on a second side of the coil.

5. The apparatus of claim 4, wherein the second metal sheet comprises a full metal sheet.

6. The apparatus of claim 1, wherein the coil comprises a coil loop along a first plane, wherein the plurality of slots overlap at least a portion of the coil loop and are positioned perpendicular to the coil loop along the first plane.

7. The apparatus of claim 1, further comprising a dielectric sheet located on a first side of the first metal sheet.

8. The apparatus of claim 1, wherein the shape of the first metal sheet further defines a fourth slot that inwardly extends from an opposite side of the periphery relative to the side of the periphery that the first slot extends, wherein the fourth slot is positioned to cancel the eddy currents in the first metal sheet at an intersection between the first slot and the fourth slot.

9. The apparatus of claim 1, further comprising a third metal sheet, the third metal sheet comprising a second plurality of slots, the second plurality of slots extending from a periphery of the third metal sheet, wherein the first metal sheet is located on a first side of the coil and the third metal sheet is located on a second side of the coil.

10. The apparatus of claim 1, wherein the first metal sheet is configured to shield the coil from a metal or foreign object or surface located within a charging region of the coil.

11. The apparatus of claim 1, further comprising a resonant circuit comprising the coil.

12. The apparatus of claim 1, wherein the plurality of slots includes slots that extend horizontally inwardly from opposite sides of the first metal sheet, and wherein pairs of slots from opposite sides of the first metal sheet overlap vertically within a center region of the first metal sheet.

13. The apparatus of claim 1, wherein the plurality of slots include slots that extend diagonally across the first metal sheet.

14. The apparatus of claim 1, wherein the plurality of slots comprise a first group of slots oriented in a first direction, and a second group of slots oriented in a second direction perpendicular to the first direction.

15. A method of shielding a wireless power transmitter, comprising:
generating, using a coil, a magnetic field sufficient to charge or power a load; and
cancelling, using a first metal sheet comprising a plurality of slots, eddy currents generated in the first metal sheet in response to the magnetic field, the first metal sheet extending over a width and a length of the coil, the plurality of slots inwardly extending from a periphery of the first metal sheet, the plurality of slots defined at least by a first slot inwardly extending from a side of the periphery, a second slot inwardly extending from the side of the periphery, and a third slot inwardly extending from the side of the periphery, wherein based on a position of the first slot and the second slot, a first eddy current component, that flows in the first metal sheet between the first slot and the second slot in response to the magnetic field, flows in an opposite direction relative to a second eddy current component that flows in the first metal sheet between the first slot and the second slot to partially cancel the eddy currents in the first metal sheet between the first slot and the second slot, wherein based on a position of the second slot and the third slot, a third eddy current component, that flows in the first metal sheet between the second slot and the third slot in response to the magnetic field, flows in an opposite direction relative to a fourth eddy current component that flows in the first metal sheet between the second slot and the third slot to partially cancel the eddy currents in the first metal sheet between the second slot and the third slot.

16. The method of claim 15, wherein one or more ferrite pieces are positioned within or match a shape of the plurality of slots.

17. The method of claim 15, further comprising shielding the coil using a second metal sheet, wherein the first metal sheet is located on a first side of the coil and the second metal sheet is located on a second side of the coil.

18. The method of claim 15, wherein the coil comprises a coil loop along a first plane, wherein the plurality of slots includes slots that overlap at least a portion of the coil loop and are positioned perpendicular to the coil loop along the first plane.

19. The method of claim 15, wherein the coil comprises a resonant circuit.

20. An apparatus for wirelessly transmitting power, the apparatus comprising:
means for generating a magnetic field sufficient to charge or power a load; and
means for shielding having a shape that defines a plurality of slots, the plurality of slots inwardly extending from a periphery of the shielding means, the shape of the shielding means defined at least by a first slot inwardly extending from a side of the periphery, a second slot inwardly extending from the side of the periphery, and a third slot inwardly extending from the side of the periphery, wherein the plurality of slots are positioned relative to one another to at least partially cancel eddy currents generated in the shielding means in response to the magnetic field, wherein based on a position of the first slot and the second slot, a first eddy current component, that flows in the shielding means between the first slot and the second slot in response to the magnetic field, flows in an opposite direction relative to a second eddy current component that flows in the shielding means between the first slot and the second slot to partially cancel the eddy currents in the shielding means between the first slot and the second slot, wherein based on a position of the second slot and the third slot, a third eddy current component, that flows in the shielding means between the second slot and the third slot in response to the magnetic field, flows in an opposite direction relative to a fourth eddy current component that flows in the shielding means between the second slot and the third slot to partially cancel the eddy currents in the shielding means between the second slot and the third slot.

21. The apparatus of claim 20, wherein the shielding means comprises one or more ferrite pieces positioned within or that match a shape of the plurality of slots.

22. The apparatus of claim 20, further comprising second means for shielding the generating means, wherein the means for shielding is located on a first side of the generating means and the second means for shielding is located on a second side of the generating means.

23. The apparatus of claim 20, wherein the generating means comprises a coil loop along a first plane, wherein the plurality of slots includes slots that overlap at least a portion of the coil loop and are positioned to be perpendicular to the coil loop along the first plane.

24. The apparatus of claim 20, wherein the generating means comprises a resonant circuit.

25. An apparatus for wirelessly transmitting power, the apparatus comprising:
a first metal sheet having a shape that defines a plurality of slots, the shape of the first metal sheet defined at least by a first slot inwardly extending from a side of a periphery of the first metal sheet, a second slot inwardly extending from the side of the periphery, and a third slot inwardly extending from the side of the periphery; and a coil, wherein the first metal sheet extends over a width and a length of the coil, wherein the coil comprises a coil loop along a first plane, wherein the plurality of slots includes slots that overlap at least a portion of the coil loop wherein the plurality of slots are positioned relative to one another to at least partially cancel eddy currents generated in the first metal sheet in response to a magnetic field generated by the coil to charge or power a load, wherein based on a position of the first slot and the second slot, a first eddy current component, that flows in the first metal sheet between the first slot and the second slot in response to the magnetic field, flows in an opposite direction relative to a second eddy current component that flows in the first metal sheet between the first slot and the second slot to partially cancel the eddy currents in the first metal sheet between the first slot and the second slot, wherein based on a position of the second slot and the third slot, a third eddy current component, that flows in the first metal sheet between the second slot and the third slot in response to the magnetic field, flows in an opposite direction relative to a fourth eddy current component that flows in the first metal sheet between the second slot and the third slot to partially cancel the eddy currents in the first metal sheet between the second slot and the third slot.

26. The apparatus of claim 25, comprising one or more ferrite pieces placed within or that match a shape of the plurality of slots.

27. The apparatus of claim 25, further comprising a second metal sheet, wherein the first metal sheet is located on a first side of the coil and the second metal sheet is located on a second side of the coil.

28. The apparatus of claim 25, wherein the plurality of slots includes slots that are positioned to be perpendicular to the coil loop along the first plane.

29. The apparatus of claim 25, wherein the first metal sheet is configured to shield the coil from a metal or foreign object or surface located within a charging region of the coil.

30. The apparatus of claim 25, wherein the shape of the first metal sheet further defines a fourth slot that inwardly extends from an opposite side of the periphery relative to the side of the periphery that the first slot extends, wherein the fourth slot is positioned to cancel the eddy currents in the first metal sheet at an intersection between the first slot and the fourth slot.

* * * * *